United States Patent [19]

Masleid et al.

[11] Patent Number: 5,442,776
[45] Date of Patent: Aug. 15, 1995

[54] ELECTRONICALLY TUNEABLE COMPUTER CLOCKING SYSTEM AND METHOD OF ELECTRONICALLY TUNING DISTRIBUTION LINES OF A COMPUTER CLOCKING SYSTEM

[75] Inventors: Robert P. Masleid; Nandor G. Thoma, both of Austin, Tex.

[73] Assignee: International Business Machines, Corp., Armonk, N.Y.

[21] Appl. No.: 269,226

[22] Filed: Jun. 30, 1994

[51] Int. Cl.$^6$ .......................... G06F 15/20; H03J 1/00
[52] U.S. Cl. ................................ 395/550; 364/270.2; 364/271.5; 364/950.3; 364/950.4
[58] Field of Search .......................................... 395/550

[56] References Cited

U.S. PATENT DOCUMENTS

| | | | |
|---|---|---|---|
| 4,309,673 | 1/1982 | Norberg et al. | 332/16 R |
| 4,338,569 | 7/1982 | Petrich | 328/155 |
| 4,759,014 | 7/1988 | Decker et al. | 370/84 |
| 4,795,985 | 1/1989 | Gailbreath, Jr. | 328/155 |
| 4,926,066 | 5/1990 | Maini et al. | 307/303.1 |
| 5,003,256 | 3/1991 | Merrill | 324/158 |
| 5,008,636 | 4/1991 | Markinson et al. | 331/12 |
| 5,087,829 | 2/1992 | Ishibashi et al. | 307/269 |
| 5,204,559 | 4/1993 | Deyhimy et al. | 307/480 |
| 5,235,566 | 8/1993 | Merrill | 368/113 |
| 5,268,656 | 12/1993 | Muscavage | 331/45 |
| 5,272,390 | 12/1993 | Watson, Jr. et al. | 307/269 |
| 5,295,164 | 3/1994 | Yamamura | 375/120 |
| 5,298,866 | 3/1994 | Kaplinsky | 328/155 |
| 5,307,381 | 4/1994 | Ahuja | 375/107 |
| 5,309,035 | 5/1994 | Watson, Jr. et al. | 307/269 |
| 5,317,202 | 5/1994 | Waizman | 307/269 |
| 5,337,321 | 8/1994 | Ozaki | 371/22.3 |
| 5,373,535 | 12/1994 | Ellis et al. | 375/106 |
| 5,381,416 | 1/1995 | Vartti et al. | 371/1 |
| 5,394,024 | 2/1995 | Buckenmaier et al. | 327/160 |

FOREIGN PATENT DOCUMENTS

| | | | |
|---|---|---|---|
| 02197912 | 8/1990 | Japan | G06F 1/10 |
| 05100768 | 4/1993 | Japan | G06F 1/10 |
| 05158575 | 6/1993 | Japan | G06F 1/4 |
| 0612140 | 1/1994 | Japan | G06F 1/10 |

Primary Examiner—Kevin A. Kriess
Assistant Examiner—St. John Courtenay, III
Attorney, Agent, or Firm—Laurence R. Letson

[57] ABSTRACT

A resonant clocking system is described which utilizes a feedback clock signal from the master clock node on a clocked chip and wherein the feedback clock signal is detected with a phase detector to determine the relevant phasing of the transmitted and the feedback received clock signals. An electronically controllable delay element is disposed within the transmission path of the clock signal on both the transmission leg and the return leg so that equal amounts of delay time may be added to the flight time in each direction. The delay may be electronically controlled to bring a "Transmitted Clock" pulse and a "Received Clock" pulse into phase. By insuring that the delay time for the entire transmission of the circuit by a particular clock pulse is an even number of cycle times, the master clock node on the clocked chip also may be controlled to be in phase with the "Transmitted Clock" pulse signal. This may be accomplished by initially calibrating the system at one-half of normal operating frequency and bringing "Transmitted Clock" pulse and "Received Clock" or feedback pulse into phase. Thereafter, upon returning to normal operating frequency, there always will be an even integral number of cycles of time delay between the transmission of the clock pulse by the oscillator and the receipt of that identical clock pulse by the phase detector; additionally, the pulse at the master clock mode will be in phase.

1 Claim, 3 Drawing Sheets

ELECTRONICALLY TUNEABLE COMPUTER CLOCKING SYSTEM AND METHOD OF ELECTRONICALLY TUNING DISTRIBUTION LINES OF A COMPUTER CLOCKING SYSTEM

FIELD OF THE INVENTION

The present invention relates to the clocking of electronic circuits and chips within complex electronic devices, such as computers, and more specifically to the electronic tuning or adjusting of the phase of the clock signal to phase or synchronize the clock signal at a master clock node on remote chips with the clock signal at the oscillator output.

BACKGROUND OF THE INVENTION

Clock pulse signals from an oscillator long have been used to control and synchronize circuit operations in computers and similar electronic apparatus.

In complex electronic systems, such as computers, processor chips and other chips such as memory chips may be separated by substantial transmission distances from the clock or oscillator circuit. Variations in the transmission distances and other uncontrollable factors introduce transmission delays of the clock signal that adversely skew or affect the synchronization of the clocking pulses at the master clock node of the variously located chips. Whenever multiple chips are being clocked from a single clock oscillator, the transmission delay time affects the synchronization of the clocking pulses at the master clock node of the remote chips. This delay may be either a partial period or a partial period plus single or multiple clock pulse periods depending upon the length of the transmission paths and the transmission speed of any other electronic elements in the transmission path.

In order to insure that clock pulses at the master clock node on each chip are in synchronization (within acceptable minimum skew) with the clock pulse emanating from the oscillator and further that each of the clock pulses at the master nodes are in synchronization with each other, the prior design approach has been to model each transmission path. The modeling takes into consideration any normal delays associated with the physical path length and with any delay characteristics of other electronic elements or devices in the path length so that all clock pulses will arrive at the master clock node of each of the chips, with minimum and acceptable skew, within a desired time window.

Considerable time and expense is commonly expended in the design of the transmission paths between the clock circuit and the remote or clocked chips to ensure proper operation and synchronization of clock pulses at each master clock node of clocked chips. Discounting other uncontrollable variables, a clock pulse sent by the oscillator then will propagate through the separate transmission lines to each of the several chips being clocked; and since the transmission time has been designed to be equal or at least a known multiple of clock pulse periods for each transmission path, in theory, a clock pulse will arrive at the master clock node of each chip or at the chip boundary within a desired time window.

Even allowing that this design process works and provides satisfactory results, the design process does not and can not take into consideration the process variables encountered in the manufacture of the individual circuit components and/or the transmission elements which can and do affect the time of transmission through these components and elements. Examples of such variables include batch to batch variations in materials used, width and thickness of the metalized paths forming the conductors, and conductive elements being manufactured under varying conditions. Even though the variables as described above or others may fall within an acceptable tolerance range and produce otherwise fully acceptable and operational elements and conductors, the resulting variances in transmission time through the elements and conductors from the nominal transmission time are not compensated for during the system design phase when incorporating these conductors and elements. Similarly, operating temperature variations are not compensated for in the initial design.

These variances from nominal may be canceling in some cases or cumulative in others; and, if cumulative, the variances may ultimately result in a sufficient skew or delay in the arrival of a clock pulse at a particular master clock node on a clocked chip to destroy the designed synchronism of the system and cause system failure unless the time window is extended to accommodate these variations. Any such time window extension will extend the cycle time for the system and cause the system to run slower.

As a result, manufacturing tolerances for all of the components and elements used within the system must be maintained at extremely stringent levels at either significant or great expense in order to precisely limit any variations in transmission time.

The foregoing disadvantages of the prior art approach to synchronize timing pulses may be overcome and the accomplishment of the objects of the invention are realized by the instant invention in the following summary of the invention.

OBJECTS OF THE INVENTION

It is an object of the invention to logically control the transmission time of clock pulses to the master clock nodes of clocked chips in a complex electronic system.

It is another object of the invention to adjust the transmission time of clocking signals over arbitrary length transmission lines to control the arrival of the clocking signal at a master clock node of a clocked chip.

It is another object of the invention to phase and synchronize the clock signal at the master clock node of the clocked chip with the clock signal provided by the oscillator clock.

SUMMARY OF THE INVENTION

If an electronically variable control is used to control the arrival time of the clock pulse at the node of the clocked chip, the variations in the manufacturing process could be allowed to assume a larger latitude from the ideal as well as the cost of maintaining extremely tight tolerancing and control of the manufacturing process may be reduced. A resonant clocking system for clocking a remote chip, and thus the electronic circuits on the chip, is comprised of a clock signal source or oscillator, a phase detector with a phase indicative output, delay programmable logic element, a clocked chip, and a pair of transmission lines extending between the delay programmable logic element and the clocked chip. The clocked chip has both a receiving amplifier and a transmitting amplifier along with a connection there-between including a master clock node for the clocked chip.

The phase detector is connected to the oscillator to receive from the oscillator a clock pulse train and also is connected to the delay programming logic element to receive a clock pulse train upon its return from the transmission loop. The phase detector compares the two pulse trains to determine the phase relationship between the two. The phase detector then will output signals indicating the phase relationship to the delay programming logic; the logic is controlled by the phase indicator signals of the phase detector to add delay time to the transmission path of both the transmission lines to and from the clocked chip. The phase comparison operations of the phase detector continue and signal the delay programming logic to add delay time until the clocking pulse from the oscillator and the clocking pulse received upon return from the transmission path together are in phase.

The phasing adjustment is accomplished at one-half the normal operational clock frequency of the system to ensure that the phase of the pulse at the master clock node on the clocked chip is identical to the phase at the phase detector at normal operational clock frequency.

After adjustment of the transmission time is accomplished through the electronic tuning of the transmission electrical path length using conventional frequency control, the frequency is returned to the normal operating frequency for the electronic system. The transmission time for the clock pulse to travel from the oscillator to the master clock node on the clocked chip and to return from the clock chip to the phase detector is adjusted at half frequency in order to eliminate the possibility of an ambiguous condition whereby the node on the clock chip is actually at a one-half phase or 180 degree phase of the clock signal while the phase of the oscillator signal and the return signal are at a zero or 360 degree phase. By accomplishing the electronic tuning at one-half the normal frequency, the node may be one-half clock period out of phase due to the transmission time equalling an odd number of clock pulse times for a complete signal round trip from the oscillator to the master clock node and back to the phase detector. However, as the clock frequency is increased to the normal operational frequency of the system due to the total loop transmission time being an even integral of the clock period, the clock pulse arrival time at the master node will be in phase with the pulse emanating from the oscillator and being received by the phase detector.

With a similar electronic tuning circuit disposed between the oscillator and the master node of each clocked chip, the clock signal may be adjusted or shifted so that the signal phase at each master clock node is identical and occurs simultaneously or at least within an acceptable time window. Since any one clock pulse is identical to all other clock pulses, the leading edge of the pulse serves as a timing or clock signal and the same identical pulse need not be present at the node of all clocked chips at the same time. Only a clock pulse being received at the master clock node of the clocked chip in synchronism with the arrival of all other clock pulses being received at the master clock nodes of their respective clocked chips is required. Thus it can be understood that the transmission time of the clocking loop may be an even integral number of cycles or clock pulses but need not be identical for all clocking loops to all of the clocked chips.

A more detailed understanding of the electronic tuning of the clocking circuit and the benefits that flow therefrom may be determined from the attached drawings and the detailed description of the invention to follow.

DRAWINGS

DETAILED DESCRIPTION OF THE BEST MODE CONTEMPLATED BY THE INVENTOR OF THE PREFERRED EMBODIMENT FOR CARRYING OUT THE INVENTION

Figure 1:
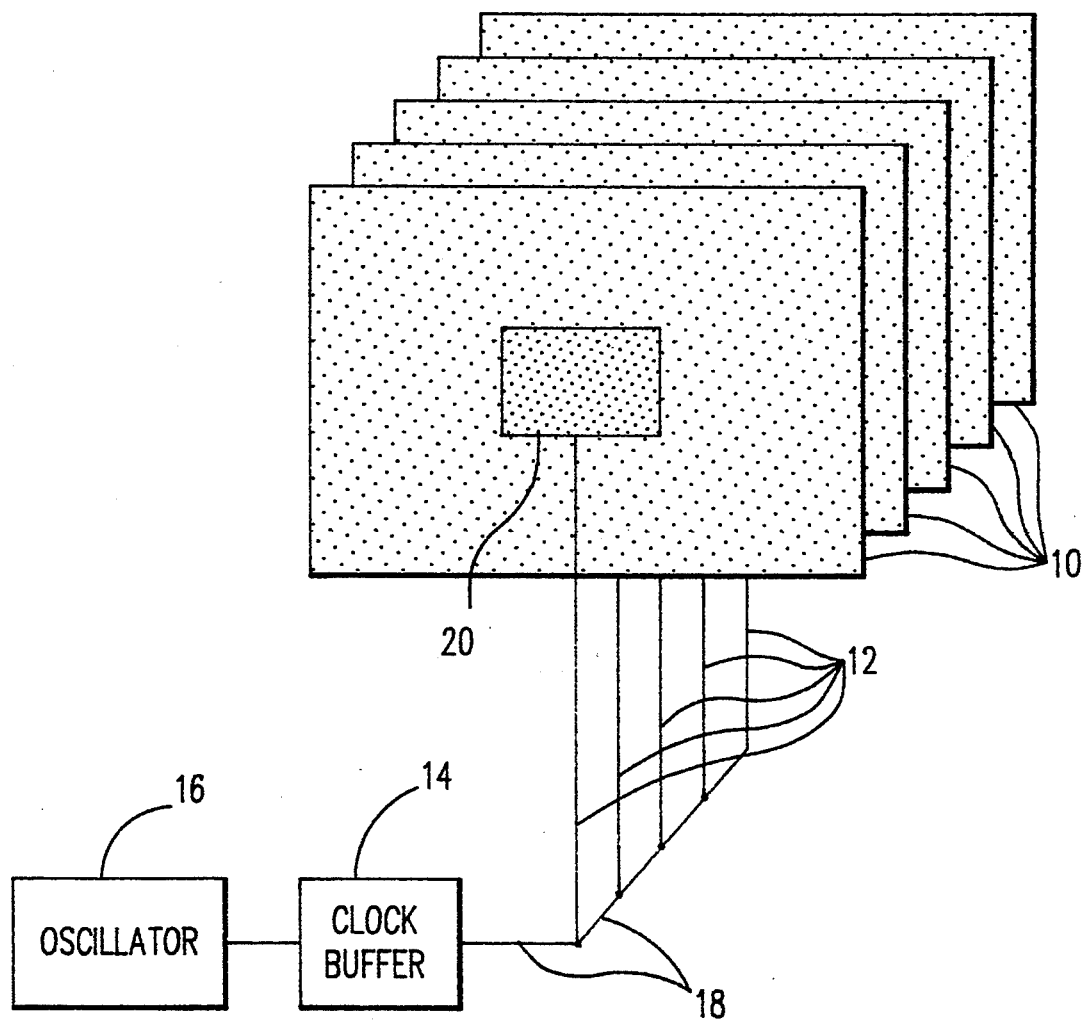
FIG. 1 illustrates a classical clocking approach to system clocking.

Referring initially to FIG. 1, the classical approach to the clocking of chips within an electronic or computer system is illustrated. Clocked chips 10 are all connected by means of clock signal paths 12 to a clock buffer 14. The clock buffer 14 is provided with a signal in the form of a clock pulse train, not shown, from oscillator 16 which provides a periodic 50% duty cycle square wave train of pulses.

Conductor transmission lines 18 extending from the clock buffer 14 to clocking lines 12 simultaneously provide to the clocked chips 10 the clock signal from the clock buffer All lines to each chip 10 could originate at the output of the clock buffer 14 rather than branching as illustrated in FIG. 1, if desired. The total line length from clock buffer 14 to the on-chip clock buffer 20 of each chip 10 is designed to be of an equal length, as measured in terms of transmission time. This approach permits clock pulses emanating from the clock buffer 14 to arrive at the on-chip buffer 20 on each clocked chip 10 at precisely the same time. While this fixed open loop approach appears to be very simple in FIG. 1, whenever chips 10 are substantially displaced from one another within a computer system, the design and implementation of equal length clock transmission lines 18, 12 is laborious, time consuming, and expensive.

Figure 2:
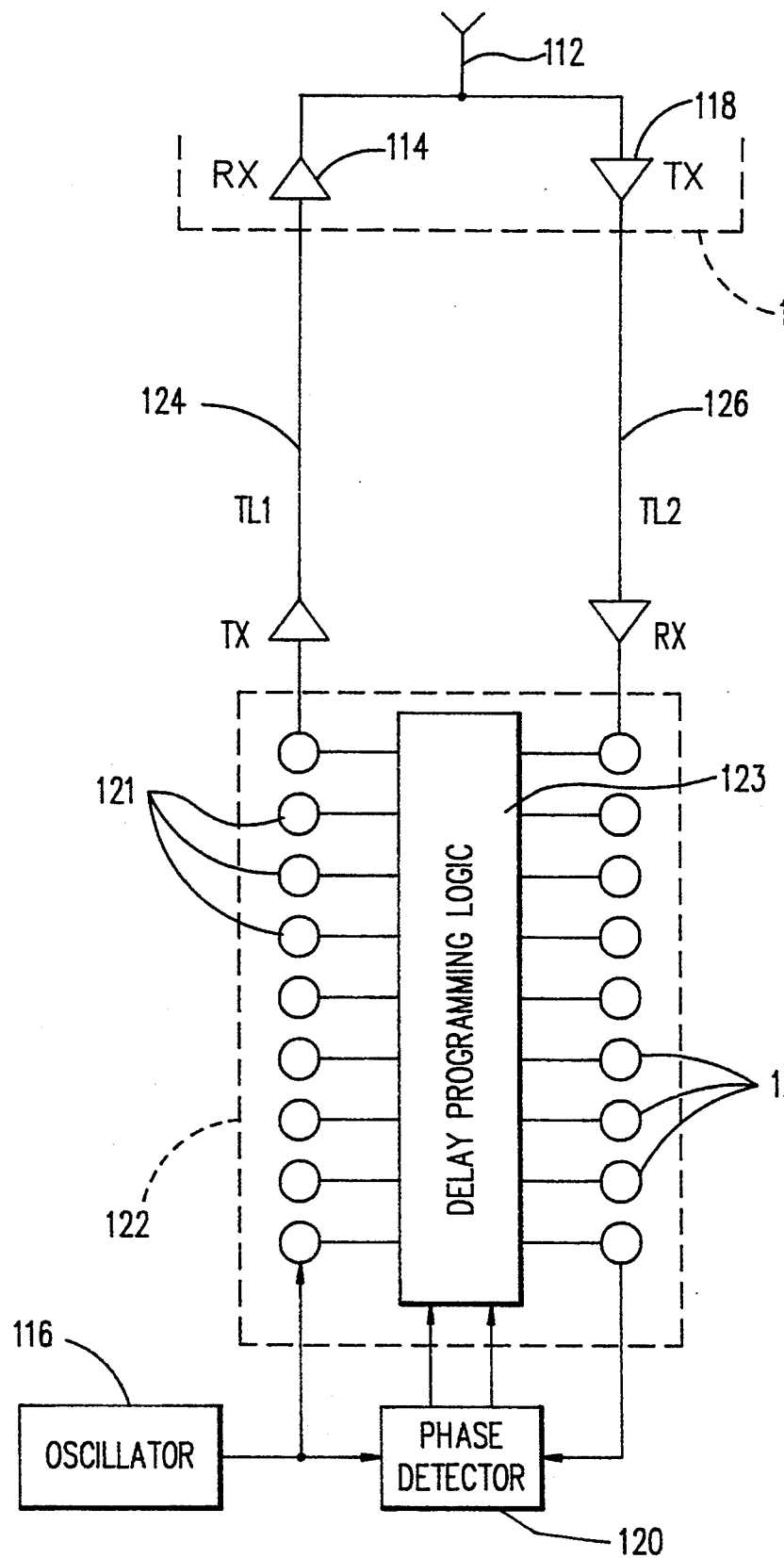
FIG. 2 illustrates the circuit of the present invention.

With an understanding of the classical approach, which results in requirements of very precise control of processing parameters, tolerances, and extensive design modeling to insure equal path lengths, reference is now made to FIG. 2.

The resonant clocking system of the present invention is provided to clock the circuits on a clocked chip 110. Clocked chip 110 comprises a plurality of electronic circuits which do not have any relevance to this invention other than being controlled by the clock pulses and therefore are not described herein. The only relationship between the present invention and the electronic circuits on clocked chip 10 is that the clocking signal for proper synchronized operation of the circuits on the chip 110 is provided by the clocking system of the subject invention Clocked chip 110 is provided with a master clock node 112, a single point on chip 110 to which a clocking signal is delivered and from which all the clocking signals for the chip circuits not shown are derived.

Chip 110 further is provided with a receiving amplifier 114 to receive any timing pulse signals sent to the chip 110 and to amplify the timing pulse signal. The result of this amplification is to strengthen and to provide an appropriate level signal while at the same time masking or removing some if not all of the noise which might be associated with the transmitted clock signal.

Chip 110 is further provided with a transmitter amplifier 118 which similarly amplifies the timing signal upon transmission from the receiving amplifier 114 to the on-chip master clock node 112. Amplifier 118 insures the signal has sufficient strength to be retransmitted back to the phase detector 120 of the resonant clocking system.

Refer now to oscillator 116, a conventional design providing a symmetric square wave of an appropriate frequency and a 50% duty cycle. The output of the oscillator 116 is connected to a phase detector 120 and to a delay circuitry 122. The delay circuitry 122 receives the oscillator 116 output in the form of a timing pulse train and transmits the same timing pulse train at a later time after delay to transmission line 124. The amount of the delay between the receipt of the signal from oscillator 116 until its transmission over the transmission line 124 is determined and alterable by the logic of the delay programming logic element 123, responsive to the phase detector 120. The delay programming logic element 123 is connected to and responds to the signals: from phase detector 120 which are indicative of the phase relationship between the timing pulse train flowing from oscillator 116 and the timing pulse train received by the phase detector 120.

Transmission line 124 extends from the delay programming logic element 123 to the receiving amplifier 114 on clocked chip 110. Extending from transmitting amplifier 118 on clocked chip 110 is transmission line 126. Transmission lines 124 and 126 are of equal length and therefore have equal transmission times of flight. The actual length of the transmission lines 124 and 126 is arbitrary and determined only by the physical layout and design of the computer system. The computer system constraints used to determine the length of transmission lines 124 and 126 are predominately the physical distance that clocked chip 110 is displaced from the delay circuitry 122 and the oscillator 116.

The delay circuitry 122 delays the signal transmitted along transmission lines 124, 126 and as the signal passes through the delay circuitry 122 from the oscillator 116 to chip 110 and back to the phase detector 120.

As can be readily observed in FIG. 2, phase detector 120 has two inputs, one from the oscillator 116 and one from the delay circuitry 122. The phase detector 120 being responsive to the two inputs yields two outputs which are conveyed to the delay programming logic 123 of delay circuit 122. The delay programming logic 123, responsive to the signals coming from phase detector 120, will make internal connections that will select which tap 121 the signal flows from in order to insert, the desired additional delay time periods commanded by the phase detector 120, thus effectively lengthening the transmission length path from the oscillator 116 to the master node 112 and back to the phase detector 120. The increase in the time delay is accomplished by delay circuitry 122 electronically lengthening transmission lines 124 and 126 to electrically adjust the clock signal propagation time or tune the circuit of FIG. 2. The signals from phase detector 120 will continue to emanate until the pulse signals flowing from oscillator 116 and the return signals coming from delay circuitry 122 are detected to be in phase by phase detector 120. Where the two signal inputs to phase detector 120 are in phase, the circuit has been tuned and the delay circuitry 122 will maintain its characteristics and provide a consistent delay time to both paths of the circuit, the outgoing path through delay circuitry 122 and transmission line 124, and the return path through transmission line 126 and delay circuitry 122. An equal amount of delay is adjusted into the flight time of the respective paths 124, 126 so that the master clock node 112 on clocked chip 110 is always at the midpoint of the complete circuit path from a timing and an electrical characteristic standpoint. The phase detector 120 and delay circuitry 122 may detect and adjust for a return lag or return lead phase difference. The delay circuitry 122 can count up or down to control the tap 121 selected for the appropriate delay.

Figure 3:
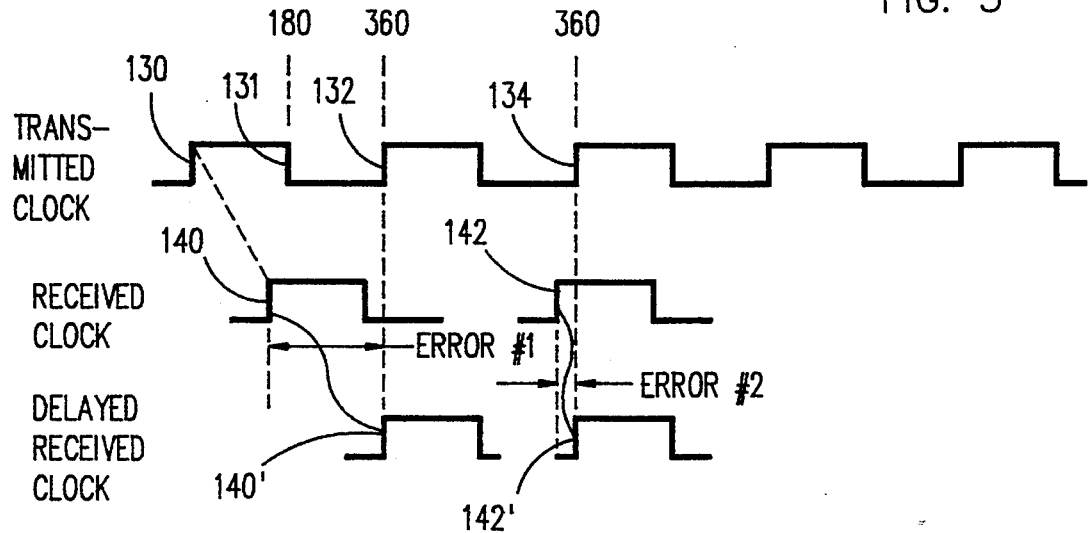
FIG. 3 is a depiction of clock timing pulses as transmitted and as received by the phase detector of the circuit illustrated in FIG. 2.

With reference now to FIG. 3, the clock pulse train which is illustrated and designated "Transmitted Clock" represents the square wave 50% duty cycle signal produced and transmitted by oscillator 116 of FIG. 2. The "Transmitted Clock" pulse train has pulse leading edges 130 at the 0 degree position, 132 at the 360 degree position of the first cycle and 134 at the 360 degree position of the second cycle.

Illustrated below the "Transmitted Clock" pulse train in FIG. 3 are illustrations representing the "Received Clock" pulses or feedback clock signal as received by phase detector 120 after transmittal through the loop to master clock node 112 and back to phase detector 120. Leading edge 140 of a received clock pulse is displaced to the right and therefore lags in time the leading edge 130 of the "Transmitted Clock" pulse. This error must be overcome in order to bring the "Received Clock" pulse leading edge 140 into phase with the clock pulses in the "Transmitted Clock" pulse train and is indicated as Error #1. Leading edge 140 may be considered not only to trail the leading edge 130 but it leads leading edge 132. Since the only adjustment that initially can be made by the delay circuitry 122 is to add delay time, "Received Clock" edge 140 effectively shifts rightward. Accordingly, edge 140 must be considered as leading edge 132. Error #1 then represents the amount of time delay that must be added to the total time of flight of the circuit, with half of the delay time added in the transmittal leg 124 and the other half of the delay time added in the return leg 126 of the circuit as illustrated in FIG. 2.

Referring to "Received Clock" pulse leading edge 142, a condition is illustrated wherein the leading edge 142 of the pulse is received more than one but less than two complete cycles of the "Transmitted Clock" train after the leading edge 130 is transmitted by oscillator 116. Under these conditions, in order to bring leading edge 142 of the "Received Clock" pulse into phase with a leading edge 134 of the "Transmitted Clock" pulse train, the leading edge 142 must be delayed sufficiently that it will become simultaneous and in phase with leading edge 134 of the "Transmitted Clock" pulse train. The amount of the delay in this instance is the amount represented graphically by Error #2. After the introduction of the time delays necessary to synchronize "Received Clock" pulse leading edge 140 with leading edge 132, the delayed clock pulse then will be as illustrated as leading edge 140'.

In the second example of a "Received Clock" pulse with the leading edge 142 having been properly delayed by introducing additional delay in the flight time required to completely transit the circuit of FIG. 2, as described above, delayed "Received Clock" pulse leading edge 142' is illustrated as aligned with leading edge 134 of the "Transmitted Clock" pulse train.

The delay between leading edge 130 and leading edge 140 is less than one complete cycle time; indicating that after adjustment and delay introduced to properly phase the received clock pulse leading edge 140' with leading edge 132, there is just one clock signal cycle time delay in the complete transmittal of the clock pulse of the oscillator 116 through the circuit and return to the phase detector 120. Similarly, there is a two cycle transit flight time for the signal whenever the leading edge 130 is received as illustrated at 142 and as adjusted and delayed to the time indicated at 142' as synchronized with leading edge 134.

These two examples illustrate a condition with an existent ambiguity in that phase detector 120 is capable only of detection of the relative phase of the leading edges 130, 132, 134, 140, 142 of each of the clock pulses. There is no capability in phase detector 120 to determine whether the delay is an odd number of cycles or an even number of cycles. Whenever an odd number of cycles of delay occur in the timing signal loop of FIG. 2, it will be appreciated that the timing signal at the master node 112 on clocked chip 110 will be the trailing edge 131 of the transmitted clock signal with the leading edge 140' and 132 perfectly in phase.

Since the propagation time of the signal from the oscillator 116 through an identical circuit to a second clocked chip 110 may require two complete cycles or an even number of cycles, the signal at the master clock node 112 of the second clocked chip 110 will correspond with the leading edge 132, when the leading edge 142' is properly aligned in time with the leading edge 134. Because of this difference in delay times, a first clocked chip may be properly in phase when a second clocked chip may be 180 degrees out of phase; this is an unacceptable condition for proper and reliable operation of a complex electronic system such as a computer since command signals and data signals will be transmitted at a time when the receiving circuit will be unable to receive or react to the transmitted data signal or command. Accordingly, it is necessary to adjust the electrical length of the circuit path of the circuit illustrated in FIG. 2 in such a way as to eliminate the ambiguity created by the possibility of the delay being an odd number of clock pulse cycles.

Figure 4:
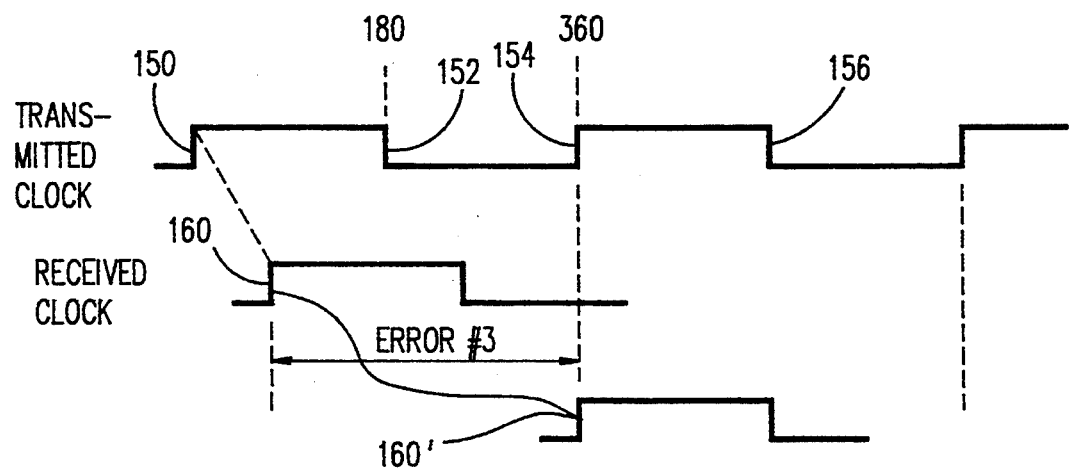
FIG. 4 depicts the half frequency timing pulses and illustrates the displacement necessary to bring the clock signal at the clocked chip master clock node into phase with the clock signal at the output of the oscillator.

Accordingly, reference is made at this point to FIG. 4 which illustrates a timing diagram wherein the "Transmitted Clock" signal is half the frequency of the "Transmitted Clock" in FIG. 3. "Transmitted Clock" pulse train in FIG. 4 has leading edges 150 and 154 and trailing edges 152 and 156. Assuming that the frequency of the "Transmitted Clock" in FIG. 4 is precisely one-half that of the frequency of the "Transmitted Clock" in FIG. 3; and, for purposes of comparison and illustration, leading edges 130, 150 are in phase and the trailing edge 152 of the half frequency "Transmitted Clock" in FIG. 4 will correspond in time to the leading edge of 132 in FIG. 3. Similarly, leading edge 154 in FIG. 4 will correspond with leading edge 134 in FIG. 3.

If an unadjusted delay in the "Received Clock" signal is less than one cycle of the full frequency signal in FIG. 3, it will accordingly be less than half a cycle in the half frequency phase relationship, as illustrated in FIG. 4, wherein leading edge 160 trails leading edge 150 by an amount equal to the trailing of leading edge 140 behind leading edge 130 as shown in FIG. 3. In order to synchronized leading edge 160 with a leading edge 154 in the half frequency "Transmitted Clock," it is necessary to delay the timing pulse leading edge 160 as received by the phase detector 120 until leading edge 160 corresponds in time and is in phase with leading edge 154. Once the time period designated Error #3 is inserted into the total circuit flight time of the timing pulse train and leading edge 160 delayed to be in phase with leading edge 154, then leading edge 160' will be aligned with leading edge 154, as illustrated in FIG. 4. Thereafter, without changing either the delay characteristics or the delay factor introduced into the circuit by the delay programming logic 123, the frequency then is returned to the full normal operating frequency as illustrated in FIG. 3. At that point the delayed "Received Clock" signal will have a leading edge 142' in phase with leading edge 134 of the "Transmitted Clock."

The net effect of adjusting the delay of the "Received Clock" signal at half frequency is to phase the "Received Clock" and the "Transmitted Clock" signals in such a way that upon return to the normal operating clock frequency there will always be an even number of clock cycles of delay from the time any particular pulse is transmitted by oscillator 116 until the same pulse is received by phase detector 120. By insuring that the delay of the "Received Clock" pulses is an amount equal to an even number of cycles of the clock pulse train at normal operating frequency, it can be assured that the signal at the master clock node 112 on any clocked chip 110 will be in phase with the transmitted clock signal as well as with the clock signal at all other master clock modes 112 on all other clocked chips 110 once the other master clock nodes 112 are similarly phase adjusted.

It will be appreciated that other digitally controllable delay circuits may be used to introduce appropriate delays and other changes made while remaining within the shape of the invention as defined by the attached claims.

What is claimed is:

1. A method of synchronizing a clocking pulse edge from a clock oscillator with a clock pulse edge at a node of a clocked chip comprising the steps of:
    a) transmitting a clock pulse train having a first frequency from a clocking source to said node;
    b) transmitting said clock pulse train from said clocking source to a phase detector;
    c) transmitting said clock pulse train from said node to said phase detector;
    d) detecting relative phase relation of said clock pulse train transmitted to said phase detector from said clocking source and said clock pulse train as received by said phase detector from said node;
    e) delaying said clock pulse train during transmission to said node for a first controlled period of time;
    f) delaying said clock pulse train during transmission from said node for a second controlled period of time equal to said first controlled period of time;
    g) responsive to said detecting step, adjusting said first and second controlled periods of time, by an equal amount of time to bring said pulse trains received by said phase detector into phase;
    h) increasing said first frequency to a frequency twice said first frequency,
    thereby synchronizing said pulse train received by said phase detector from said clocking source with said pulse train at said node.

* * * * *